United States Patent [19]

Kanoh et al.

[11] Patent Number: 5,746,809
[45] Date of Patent: May 5, 1998

[54] ACTIVATING CATALYTIC SOLUTION FOR ELECTROLESS PLATING

[75] Inventors: Osamu Kanoh, Ohmihachiman; Yasushi Yoshida, Shiga-ken; Atsuo Senda, deceased, late of Kyoto-fu, all of Japan, by Eiko Senda, Yoshio Senda, Hiroko Senda, Masako Senda, legal representatives

[73] Assignee: Murata Manufacturing Co., Ltd., Kyoto, Japan

[21] Appl. No.: 839,432

[22] Filed: Apr. 10, 1997

[30] Foreign Application Priority Data

Apr. 9, 1996 [JP] Japan ................. 8-086725

[51] Int. Cl.$^6$ ................................. C23C 18/28
[52] U.S. Cl. .......................... 106/1.11; 106/1.24
[58] Field of Search .................... 106/1.05, 1.11, 106/1.22, 1.23, 1.24; 427/98, 437, 304, 305, 553, 559

[56] References Cited

U.S. PATENT DOCUMENTS

| 3,791,340 | 2/1974 | Ferrara | 106/1.11 |
| 4,425,378 | 1/1984 | Maher | 106/1.11 |
| 4,806,159 | 2/1989 | De Keyser et al. | 106/1.11 |

FOREIGN PATENT DOCUMENTS

| 143951 | 6/1985 | European Pat. Off. |
| 687136 | 12/1995 | European Pat. Off. |
| 4033518 | 7/1991 | Germany | 106/1.11 |
| 19642922 | 4/1997 | Germany |

OTHER PUBLICATIONS

Thomas H. Baum, et al., "Photoselective Plating of Metals for Circuitizaiton and Top–Surface Imaging", pp. 335–343.

Thomas H. Baum, et al., "Selective Plating of Copper for Circuitization of Teflon and Epoxy–Based Substrates", *The Electrochemical Society Proceedings*, vol. 94–31, pp. 320–327.

*Primary Examiner*—Shrive Beck
*Assistant Examiner*—Brian K. Talbot
*Attorney, Agent, or Firm*—Ostrolenk, Faber, Gerb & Soffen, LLP

[57] ABSTRACT

Disclosed is an activating catalytic solution for electroless plating which makes possible carrying out successive processes efficiently, without using organic solvent, involving preparation of activating catalytic solution for forming substrate film, formation of a photo-sensitive film by providing the activating catalytic solution, creation of activating catalyst by exposure of specific areas of the photo-sensitive film to light, development by rinsing unexposed portions of the photo-sensitive film, and immersion of the substrate in an electroless plating bath. The activating catalyst can be created with high sensitivity to light at small energy of radiation. The activating catalytic solution preferably contains zinc oxalate, a copper salt, palladium salt such as palladium chloride, and an alkaline solution such as an ammonia water. The activating catalytic solution is used for forming a photo-sensitive film on a substrate to be subjected to electroless plating.

12 Claims, No Drawings

ACTIVATING CATALYTIC SOLUTION FOR ELECTROLESS PLATING

BACKGROUND OF THE INVENTION

This invention relates to an activating catalytic solution for electroless plating and a method of electroless plating using the same.

Electroless plating is applied to form a conductive film having a predetermined pattern on substrates made of alumina, dielectric ceramic, polyimide, glass-epoxy, ferrite, or the like, for the applications such as high-frequency coils, high frequency filters, capacitors and hybrid ICs. When electroless plating is carried out, activation is required for the surface of the substrate. An activating catalytic solution is utilized for such activation.

The activating catalytic solution is provided on the substrate to thereby form a photo-sensitive film on it. When the activating catalytic solution is applied onto the substrate and thereafter radiated with a ultraviolet ray or a laser beam, activation is selectively achieved, limited to the radiated areas. When only specific areas are to selectively be electroless-plated using the activating catalytic solution, a conductive film with a fine pattern can be efficiently formed on the substrate utilizing a photolithography technique.

Conventionally, there has been used as an activating catalytic solution which contains a palladium acetylacetonate dissolved in an organic solvent such as chloroform (hereinafter referred to as "first conventional art"). The activating catalytic solution is applied to an appropriate substrate so as to form a photo-sensitive film thereon. The photo-sensitive film is radiated by a laser beam or a ultra-violet ray through a photomask and this causes deposition of palladium metal on the substrate only at light-exposed areas. Thereafter, the unexposed portion of the photomask is washed away by an organic solvent such as chloroform. As a result, the remaining film of palladium metal is developed into a pattern in a manner correlating to the photomask pattern. When the substrate is immersed in an electroless plating bath, the palladium metal acts as an activating catalyst to form an electroless plating film over the substrate.

There also is a selective electroless plating method using an activating catalytic solution containing iron II oxalate and palladium chloride dissolved in a potassium hydroxide solution, which method is described in "SELECTIVE PLATING OF COPPER FOR CIRCUITIZATION OF TEFLON AND EPOXY-BASED SUBSTRATES" by Thomas H. Baum et al. in 94-31 volume of "The Electrochemical Society Proceedings" (hereinafter referred to as "second prior art").

There is further a selective electroless plating method laid open to public as European Patent Publication No. 687,136, which uses an activating catalytic solution containing oxalic salt such as iron II oxalate and ruthenium oxalate, palladium chloride, and ammonia water (hereinafter referred to as "third prior art").

In the aforesaid first prior art, an organic solvent such as chloroform has to be used in the development process. Such an organic solvent and accordingly cannot be used in great quantity in an easygoing manner. It is also comparatively difficult to completely wash away unexposed portions of the photo-sensitive film. If unexposed portions of the photo-sensitive film remains, a problem is encountered in that clarity is lacking in the plating film resulting from the subsequent electroless plating process. That raises another problem in that a large-energy light source, e.g., an excimer laser, is required for light exposure of the photo-sensitive film and the light exposure takes long time incurring additional costs.

On the other hand, the second and third prior arts utilize hydrophilic palladium chloride so that it is possible to implement the development process using water. Accordingly, the unexposed photo-sensitive film can readily be completely washed away by the use of a large quantity of water. However, the photo-sensitive film according to the second prior art is low in light exposure sensitivity, thereby requiring a long time of light exposure. Furthermore, if this is used as an activating catalytic solution to form a metal film by electroless plating, the metal film is comparative low in electric conductivity and accordingly, disadvantageous in high-frequency characteristics. The metal film electroless plated has the further disadvantage that it is relatively low in adherence strength to the substrate. In order to raise the adherence strength, it is possible to take the countermeasure of etching the surface of the substrate. However, there are cases where such etching is difficult because of the material of the substrate.

It is therefore the object of the present invention to provide an activating catalytic solution for electroless plating and a method of electroless plating using same, which are capable of solving the problems encountered in the above-stated first to third prior arts.

SUMMARY OF THE INVENTION

An activating catalytic solution for electroless plating according to the present invention contains zinc salt, copper salt, palladium salt, and an alkaline solution to provide hydrophilicity, wherein at least one of the zinc and copper salts is an oxalate. Preferably, the copper salt used is at least one selected from the group consisting of copper oxalate, copper chloride and copper sulfate. Also, palladium chloride may be used as palladium salt. Further, an ammonia water can be used as the alkaline solution. Part of said zinc oxalate may be replaced by another zinc salt, e.g., zinc chloride. A hydrophilic binder such as polyvinyl alcohol is added to the activating catalytic solution, if desired, in order to facilitate the provision of the activating catalytic solution homogeneously onto a substrate.

In another aspect of the present invention, the activating catalytic solution for electroless plating contains zinc chloride, copper oxalate, palladium salt and an alkaline water to provide hydrophilicity.

In the method of electroless plating according to the present invention, the above-stated activating catalytic solution is used on a substrate to form a photo-sensitive film on the substrate. This photo-sensitive film is radiated by light to thereby deposit a palladium catalyst on the substrate. By immersing the substrate having palladium catalyst deposited thereon into an electroless plating bath, an electroless plating film is formed on the substrate using the palladium metal as activating catalyst.

In the method of electroless plating as stated above, it is preferred that a development process is further provided to wash away unradiated areas of the photo-sensitive film using water or liquid based on water. The light can be radiated to a specified area by, for example, a ultraviolet ray through a photomask or scanning of a laser beam radiation light onto the photo-sensitive film.

The activating catalytic solution of the present invention provides hydrophilicity so that the photo-sensitive film for electroless plating can be provided without utilization of organic solvents and further, the development process can be implemented as required. As a consequence, it is possible to utilize a water-system treatment process wholly consistent from the activating catalytic solution preparing process, the substrate applying process, the development process and even the electroless plating process.

Consequently, the use of water instead of organic solvent expectedly leads to reduction of cost. When performing the development process, washing with water makes possible washing-away of unradiated portion of the photo-sensitive film using a quantity of water. Accordingly, unwanted portions of the photo-sensitive film are completely removed to thereby enhance the resolution in patterning the plating film, consequently enabling the formation of a finer pattern. If water used for the development process remains, the subsequent electroless plating process can immediately be carried out without trouble. Therefore, the successive operations for electroless plating are efficiently put forward.

The activating catalytic solution of the present invention is highly sensitive to light. Accordingly, a sufficient amount of palladium catalyst can be achieved even if the light energy such as an ultraviolet ray is low or even if the light exposure time period is short. For example, it has been confirmed according to the most preferred example that the deposition of palladium catalyst is possible in an extremely short exposure time period of 5 seconds, where the radiation is at 10 mmW/cm$^2$ with using an excimer lamp of 172 nm wavelength. In contrast to this, the first prior art requires an exposure time period of 5 minutes or longer.

The plating film formed from the activating catalytic solution by electroless plating according to the present invention has a high adhesion strength to the substrate. Accordingly, sufficient adherence strength can be provided even if no etching is performed beforehand on the substrate. It is therefore possible to form a plating film with sufficient adhesion strength by applying electroless plating even to such substrates that are difficult to etch.

The plating film formed from the activating catalytic solution by electroless plating according to the present invention can maintain the electric conductivity inherently possessed by the metal forming the plating film. It is therefore possible without problem to use the plating film for formation of high-frequency circuits.

PREFERRED EMBODIMENTS OF THE INVENTION

Example 1

In order to prepare 10 ml activating catalytic solutions respectively for samples 1 to 5, zinc oxalate, copper oxalate and palladium chloride were dissolved in composition ratio as shown in Table 1, using ammonia water (28%) in an amount of 2 ml, and then diluted by water in an amount of 8 ml. The solutions obtained were filtered using a milli-pore filter.

TABLE 1

| Sample No. | 1 | 2 | 3 | 4 | 5 |
|---|---|---|---|---|---|
| zinc oxalate | 0.09 g | 0.07 g | 0.05 g | 0.03 g | 0.01 g |
| copper oxalate | 0.01 g | 0.03 g | 0.05 g | 0.07 g | 0.09 g |
| palladium chloride | 0.05 g | 0.05 g | 0.05 g | 0.05 g | 0.05 g |

Then, the activating catalytic solutions of samples 1 to 5 were spin-coated onto an alumina substrate at a rotating speed of 1000 rpm for 30 seconds, thereby forming a photo-sensitive film. Subsequently the photo-sensitive films were radiated by an ultraviolet ray from an excimer lamp (wavelength: 172 nm) through a quartz-chromium photomask at a luminous intensity of 10 mmW/cm$^2$ for 30 seconds or 60 seconds, and thereafter rinsed with water. The photo-sensitive films were then subjected to electroless plating by being immersed 10 minutes in a one liter electroless plating bath (60° C.) of 1 litter having a composition as follows:

| | |
|---|---|
| NiSO$_4$.6H$_2$O | 30 g |
| sodium phosphinate monohydrate | 10 g |
| sodium acetate (anhydrous) | 10 g |

The samples 1 to 5 thus obtained were observed with respect to the state of deposition of a nickel-containing electroless plating film. The results are shown in below Table 2.

TABLE 2

| Sample No. | 1 | 2 | 3 | 4 | 5 |
|---|---|---|---|---|---|
| 30 second radiation | Deposition | Deposition | Deposition | Deposition | Deposition |
| 60 second radiation | Depositing rapidly | Depositing rapidly | Deposition | Deposition | Deposition |

As shown in Table 2, the use of the activating catalytic solutions containing zinc oxalate, copper oxalate, palladium chloride and ammonia water, with a ultraviolet ray radiated for a time period of 60 seconds, causes deposition of a nickel-phosphorous alloy electroless plating film on each of samples 1 to 5. Among these, rapid deposition was possible on samples 1 and 2, and even if the time period of ultraviolet ray radiation is reduced to as short as 30 seconds, deposition of a nickel electroless plating film was still possible on samples 1 and 2.

Example 2

In order to find a more preferred composition ratio of zinc oxalate and copper oxalate based on the results of example 1, preparations were made for activating catalytic solutions for samples 6 to 11 which are varied in composition ratio of zinc oxalate and copper oxalate in a manner similar to example 1, as shown in Table 3.

TABLE 3

| Sample No. | 6 | 7 | 8 | 9 | 10 | 11 |
|---|---|---|---|---|---|---|
| zinc oxalate | 0.097 g | 0.095 g | 0.09 g | 0.085 g | 0.08 g | 0.07 g |
| copper oxalate | 0.003 g | 0.005 g | 0.01 g | 0.015 g | 0.02 g | 0.03 g |
| palladium chloride | 0.03 g | 0.03 g | 0.03 g | 0.03 g | 0.03 g | 0.03 g |

Then, the activating catalytic solutions samples 6 to 11 were each spin-coated to form a photo-sensitive film in the same manner as example 1. The photo-sensitive film is radiated by a ultraviolet ray as described above for 5 seconds, 10 seconds or 25 seconds, and thereafter rinsed with water and immersed in an electroless plating bath for 10 minutes. In this manner, electroless plating was carried out.

Samples 6 to 11 thus obtained were observed with respect to the state of the nickel electroless plating film. The results are shown in below Table 4.

TABLE 4

| Sample No. | 6 | 7 | 8 | 9 | 10 | 11 |
|---|---|---|---|---|---|---|
| 5 second radiation | No Deposition | No Deposition | Deposition | Deposition | Deposition | No Deposition |
| 10 second radiation | No Deposition | Deposition | Deposition | Deposition | Deposition | Deposition |
| 25 second radiation | Deposition | Deposition | Deposition | Deposition | Deposition | Deposition |

As shown in Table 4, where the time period of ultraviolet ray radiation is 25 seconds, all of samples 6 to 11 had a nickel-containing electroless plating film deposited thereon. Where the time period of ultraviolet ray radiation is 10 seconds, samples 7 to 11 were deposited with a nickel-containing electroless plating film. Furthermore, even where the time period of ultraviolet ray radiation is shortened to 5 seconds, there was found deposition of a nickel electroless plating film on samples 8 to 10. It will be understood from this that the deposition is possible by properly selecting the composition ratio of zinc oxalate and copper oxalate even if the time period of ultraviolet ray radiation is reduced to, for example, as short as 5 seconds.

On sample 10 which was obtained from the activating catalytic solution through radiation of ultraviolet ray for 10 seconds, there was confirmed formation of a nickel-containing pattern having a thickness of 0.3 µm and a resolution of 25 µm (line/space) over the substrate thereof.

Example 3

Although zinc oxalate and copper oxalate were varied in composition ratio in example 2, this example 3 contains palladium chloride varied in composition ratio so as to prepare activating catalytic solutions for samples 12 to 16 in the same manner as example 1, as shown in below Table 5.

TABLE 5

| Sample No. | 12 | 13 | 14 | 15 | 16 |
|---|---|---|---|---|---|
| zinc oxalate | 0.07 g | 0.07 g | 0.07 g | 0.07 g | 0.07 g |
| copper oxalate | 0.03 g | 0.03 g | 0.03 g | 0.03 g | 0.03 g |
| palladium chloride | 0.01 g | 0.02 g | 0.03 g | 0.04 g | 0.05 g |

Then, the activating catalytic solutions for samples 12 to 16 were each spin-coated to form a photo-sensitive film in the same manner as example 1. The photo-sensitive films were radiated by a ultraviolet ray for 10 seconds, 20 seconds or 30 seconds, and thereafter rinsed by water and immersed in an electroless plating bath for 10 minutes. In this manner, electroless plating was carried out.

Samples 12 to 16 thus obtained were observed with respect to the state of deposition for the nickel-containing electroless plating film. The results are shown in below Table 6.

TABLE 6

| Sample No. | 12 | 13 | 14 | 15 | 16 |
|---|---|---|---|---|---|
| 10 second radiation | Delayed Precipitation | Delayed Precipitation | Precipitation | Precipitation | Precipitation |
| 20 second radiation | Delayed Precipitation | Precipitation | Precipitation | Precipitation | Precipitation |

TABLE 6-continued

| Sample No. | 12 | 13 | 14 | 15 | 16 |
|---|---|---|---|---|---|
| 30 second radiation | Precipitation | Precipitation | Precipitation | Precipitation | Precipitation |

As shown in Table 6, even where the time period of ultraviolet ray radiation is short, i.e. 30 seconds, 20 seconds or 10 seconds, deposition of a nickel-containing electroless plating film occurred on each of samples 12 to 16. The expressions "delayed deposition" at "10 seconds" and "20 seconds" in example 12 and "10 seconds" in example 13, means that deposition started 2 to 3 minutes after immersion into the electroless plating bath. As a result of immersion of 10 minutes duration, there found preferable deposition for a nickel-containing electroless plating film.

Example 4

Although copper oxalate was used in examples 1 to 3 as the copper salt, copper chloride was employed in this example 4. Activating catalytic solutions for samples 17 to 19 were prepared by varying the ratio of zinc oxalate, copper chloride, and palladium chloride in the same manner as example 1, as shown in Table 7.

TABLE 7

| Sample No. | 17 | 18 | 19 |
|---|---|---|---|
| zinc oxalate | 0.09 g | 0.08 g | 0.07 g |
| copper chloride | 0.01 g | 0.02 g | 0.03 g |
| palladium chloride | 0.04 g | 0.04 g | 0.04 g |

Then, the activating catalytic solutions of samples 17 to 19 were each spin-coated to form a photo-sensitive film in the same manner as example 1. The photo-sensitive films were radiated by a ultraviolet ray for 10 seconds, 20 seconds or 30 seconds, and thereafter rinsed by water and then submerged in an electroless plating bath for 10 minutes. In this manner, electroless plating was carried out.

Samples 17 to 19 were observed with respect to the state of deposition for the nickel-containing electroless plating film thus obtained. As a result, even where the time period of ultraviolet ray radiation was shortened to 30 seconds, 20 seconds or 10 seconds, all of samples 17 to 19 had a deposition nickel electroless plating film.

Where copper sulfate was used as copper salt instead of copper chloride, similar effects were obtained.

Example 5

Example 5 lies out of the scope of the present invention.

In example 5, zinc chloride was employed in place of zinc oxalate used in above example 4. Activating catalytic solutions for samples 20 to 22 were respectively prepared by varying the amount of zinc chloride, copper chloride and palladium chloride, in the manner similar to example 1, as shown in Table 8.

TABLE 8

| Sample No. | 20 | 21 | 22 |
| --- | --- | --- | --- |
| zinc chloride | 0.09 g | 0.08 g | 0.07 g |
| copper chloride | 0.01 g | 0.02 g | 0.03 g |
| palladium chloride | 0.04 g | 0.04 g | 0.04 g |

Then, the activating catalytic solutions of samples 20 to 22 were each spin-coated to form a photo-sensitive film, in the same manner as the example 1. The photo-sensitive film was radiated by a ultraviolet ray for 10 seconds, 20 seconds or 30 seconds, and thereafter rinsed by water and immersed in an electroless plating bath for 10 minutes. In this manner, electroless plating was carried out.

Samples 20 to 22 were observed with respect to the state of deposition for the nickel-containing electroless plating film thus obtained. As a result, whether the time period of ultraviolet radiation was 10 seconds, 20 seconds, or 30 seconds, no deposition occurred for a nickel-containing electroless plating film in any case. According to example 5, it will be understood that zinc oxalate has an important role for implementing preferable electroless plating.

Example 6

In example 6 (outside the scope of the invention), oxalic acid in place of oxalate salt was added to the composition of above example 4. That is, activating catalytic solutions for samples 23 to 25 were respectively prepared by varying the ratio of zinc chloride, copper chloride and palladium chloride in the similar manner to example 1, as shown in Table 9.

TABLE 9

| Sample No. | 23 | 24 | 25 |
| --- | --- | --- | --- |
| zinc chloride | 0.08 g | 0.08 g | 0.08 g |
| copper chloride | 0.02 g | 0.02 g | 0.02 g |
| oxalic acid | 0.02 g | 0.05 g | 0.10 g |
| palladium chloride | 0.04 g | 0.04 g | 0.04 g |

Using the activating catalytic solutions for samples 23 to 25, photo-sensitive films were respectively formed by spin-coating in the same manner as example 1. Subsequently, the photo-sensitive film was radiated by a ultraviolet ray for 10 seconds, 20 seconds or 30 seconds, and thereafter rinsed by water and submerged in an electroless plating bath for 10 minutes. In this manner, electroless plating has been carried out.

Samples 23 to 25 thus obtained were observed with respect to the state of deposition of the nickel-containing electroless plating film. As a result, whether the time period of ultraviolet radiation was 10 seconds, 20 seconds or 30 seconds, no deposition occurred for a nickel-containing electroless plating film in any case. According to example 6, it will be understood that, even where oxalic acid and zinc chloride are both present, electroless plating cannot preferably be performed so long as zinc oxalate is not present.

Example 7

Example 7 lies out of the scope of the present invention.

In example 7, the solution contained zinc oxalate without any copper salt. That is, the activating catalytic solutions for samples 26 to 28 were respectively prepared by varying the ratio of zinc oxalate and palladium chloride in the similar manner to example 1, as shown in Table 10.

TABLE 10

| Sample No. | 26 | 27 | 28 |
| --- | --- | --- | --- |
| zinc oxalate | 0.1 g | 0.02 g | 0.03 g |
| palladium chloride | 0.1 g | 0.1 g | 0.1 g |

Using the activating catalytic solutions for above samples 26 to 28, photo-sensitive films were respectively formed by spin-coating in the same manner as the example 1. Subsequently, the photo-sensitive film was radiated by a ultraviolet ray for 1 minutes, 3 minutes or 5 minutes, and thereafter rinsed with water and immersed in an electroless plating bath for 10 minutes. In this manner, electroless plating has been carried out.

Samples 26 to 28 thus obtained were observed with respect to the state of deposition for a nickel-containing electroless plating film. As a result, whether the time period of ultraviolet radiation was long, i.e., 1 minute, 3 minutes or 5 minutes, there occurred no deposition for a nickel-containing electroless plating film in any case. According to example 7, it will be understood that, even where oxalic acid is contained, electroless plating cannot preferably be performed when no copper salt is used.

Example 8

Example 8 lies in the scope of the present invention.

In example 8, activating catalytic solutions for samples 29 to 31 were respectively prepared by varying the ratio of zinc chloride, copper oxalate and palladium chloride in the similar manner to example 1, as shown in Table 11.

TABLE 11

| Sample No. | 29 | 30 | 31 |
| --- | --- | --- | --- |
| zinc chloride | 0.09 g | 0.08 g | 0.07 g |
| copper oxalate | 0.01 g | 0.02 g | 0.03 g |
| palladium chloride | 0.04 g | 0.04 g | 0.04 g |

Using the activating catalytic solutions for above samples 29 to 31, photo-sensitive films were respectively formed by spin-coating in the same manner as the example 1. Subsequently, the photo-sensitive film was radiated by a ultraviolet ray for 10 seconds, 20 seconds or 30 seconds, and thereafter rinsed with water and immersed in an electroless plating bath for 10 minutes. In this manner, electroless plating has been carried out.

Samples 29 to 31 thus obtained were observed with respect to the state of deposition for a nickel-containing electroless plating film. The results are shown in Table 12.

TABLE 12

| Sample No. | 29 | 30 | 31 |
| --- | --- | --- | --- |
| 10 second radiation | No Deposition | No Deposition | No Deposition |

TABLE 12-continued

| Sample No. | 29 | 30 | 31 |
| --- | --- | --- | --- |
| 20 second radiation | No Deposition | No Deposition | No Deposition |
| 30 second radiation | No Deposition | No Deposition | No Deposition |

As shown in Table 12, when the time period of ultraviolet ray radiation is 10 seconds, there was no deposition in samples 29 to 31 for a nickel-containing electroless plating film. However, when the time period of radiation is 20 seconds, sample 29 had deposition for a nickel-containing electroless plating. Further, when the time period of radiation is 30 seconds, sample 30 had deposition for a nickel-containing electroless plating film. According to example 8, even where no zinc oxalate is used, if copper oxalate is used as the copper salt, it is possible to cause deposition for a nickel-containing electroless plating film by selecting the time period of ultraviolet ray radiation.

Where zinc sulfate is used as the zinc salt in place of zinc chloride, the similar effects were obtained.

The compositions of the activating catalytic solutions for examples 1 to 4 and 8 lying in the scope of the present invention are merely examples. For example, for an amount of 10 ml of the activating catalytic solution, the content of each of the zinc oxalate and copper salts can be altered within a range of about 0.01 to 0.30 g. The preferred amount of zinc oxalate is about 0.01–0.1, more preferably about 0.08–0.09 and the preferred amount of copper salt is about 0.01–0.1, more preferably about 0.01–0.03. The content of palladium chloride can be altered within a range of about 0.01 to 0.15 g. and is preferably about 0.03 to 0.05. The content of ammonia water can be altered within a range of about 1 to 5 ml. Furthermore, in place of palladium chloride, it is possible to employ other hydrophilic palladium salts, e.g., sulfuric salts, nitric salts, acetic salts of palladium or the like.

Furthermore, in order to facilitate the settlement of the activating catalytic solution onto the substrate, a hydrophilic binder, etc. such as polyvinyl alcohol, may be added to the activating catalytic solution.

Also, the wavelength of radiation light to the photo-sensitive film can be varied within a range of about 100 to 400 nm.

Although, nickel electroless plating was done in the above-stated examples, this invention is applicable also to a case where electroless plating of another metal such as copper, palladium and gold, is performed.

Furthermore, the substrate subjected to electroless plating treatment is not limited to an alumina substrate as illustrated, but other substrate such as a dielectric ceramic substrate, a polyimide substrate, a glass-epoxy substrate, a ferrite substrate, etc., may be used.

Furthermore, it is possible to implement the electroless plating method according to this invention by omitting the development process using water rinsing. The development process may be omitted if there is no necessity of enhancing resolution of the plating film so as to be considerably high, for example where exposure is done over the entire area of the photo-sensitive film instead of selective exposure to a specified area thereof and also where selective exposure is made to a specified area. Such omission of the development process is due to hydrophilicity by the activating catalytic solution, which is different from the aforesaid first prior art.

Where the development process is practiced, rinsing can be performed with using a liquid based on water in place of water. Furthermore, other liquids may be employed without exclusion.

What is claimed is:

1. A activating catalytic solution for hydrophilic electroless plating comprising an alkaline solution of zinc salt, copper salt and palladium salt wherein at least one of the zinc and copper salts is oxalate.

2. An activating catalytic solution according to claim 1, wherein the zinc salt comprises zinc oxalate.

3. An activating catalytic solution according to claim 2, wherein said palladium salt is palladium chloride.

4. An activating catalytic solution according to claim 3, wherein said alkaline solution contains ammonia.

5. An activating catalytic solution according to claim 1, wherein said zinc salt comprises at least one of zinc chloride and zinc sulfate.

6. An activating catalytic solution according to claim 4, wherein said copper salt is at least one member selected from the group consisting of copper oxalate, copper chloride and copper sulfate.

7. A activating catalytic solution for hydrophilic electroless plating according to claim 6 in which the alkaline solution is aqueous.

8. An activating catalytic solution according to claim 1, wherein the concentration of zinc salt is about 0.01–0.3 g/10 ml, the concentration of copper salt is about 0.01–0.3 g/10 ml, and the concentration of palladium salt is about 0.01–0.15 g/10 ml.

9. An activating catalytic solution according to claim 8, wherein the concentration of zinc salt is about 0.01–0.1 g/10 ml, and the concentration of copper salt is about 0.01–0.1 g/10 ml.

10. An activating catalytic solution according to claim 9, wherein the concentration of zinc salt is about 0.08–0.09 g/10 ml, the concentration of copper salt is about 0.01–0.03 g/10 ml, and the concentration of palladium salt is about 0.03–0.05 g/10 ml.

11. An activating catalytic solution according to claim 1, wherein said copper salt is at least one member selected from the group consisting of copper oxalate, copper chloride and copper sulfate.

12. A activating catalytic solution for hydrophilic electroless plating according to claim 1 in which the alkaline solution comprises aqueous ammonia.

* * * * *